United States Patent [19]
Chen

[11] Patent Number: 5,744,391
[45] Date of Patent: Apr. 28, 1998

[54] METHOD TO IMPROVE ISOLATION BETWEEN EEPROM DEVICES VIA A FIELD OXIDE ANNEAL

[75] Inventor: Jen-Te Chen, Changhua City, Taiwan

[73] Assignee: Taiwan Semiconductor Manufacturing Company Ltd., Hsin-Chu, Taiwan

[21] Appl. No.: 783,982

[22] Filed: Jan. 15, 1997

[51] Int. Cl.⁶ .................................................. H01L 21/336
[52] U.S. Cl. .......................... 438/264; 438/263; 438/530; 438/449
[58] Field of Search ................................. 438/263, 264, 438/449, 530, 439, 443

[56] References Cited

U.S. PATENT DOCUMENTS

| | | | |
|---|---|---|---|
| 4,642,880 | 2/1987 | Mizutani et al. | 438/449 |
| 4,648,937 | 3/1987 | Ogura et al. | 156/643 |
| 5,316,965 | 5/1994 | Philipossian et al. | 437/70 |
| 5,376,577 | 12/1994 | Roberts et al. | 437/52 |
| 5,385,630 | 1/1995 | Philipossian et al. | 156/628 |
| 5,427,970 | 6/1995 | Hsue et al. | 438/264 |
| 5,591,681 | 1/1997 | Wristers et al. | 438/264 |

*Primary Examiner*—Trung Dang
*Attorney, Agent, or Firm*—George O. Saile; Stephen B. Ackerman

[57] ABSTRACT

A process for improving the isolation between devices of an EEPROM cell, has been developed. A high temperature anneal step is performed after an arsenic ion implantation procedure, used to create tunnel transistors for the EEPROM cell. The anneal procedure allows the high concentration of arsenic, implanted into a the top portion of a FOX region during the formation of the tunnel transistors, to be distributed throughout the FOX region, resulting in reduction in the etch rate of the FOX region, during HF containing, pre-clean procedures.

16 Claims, 3 Drawing Sheets

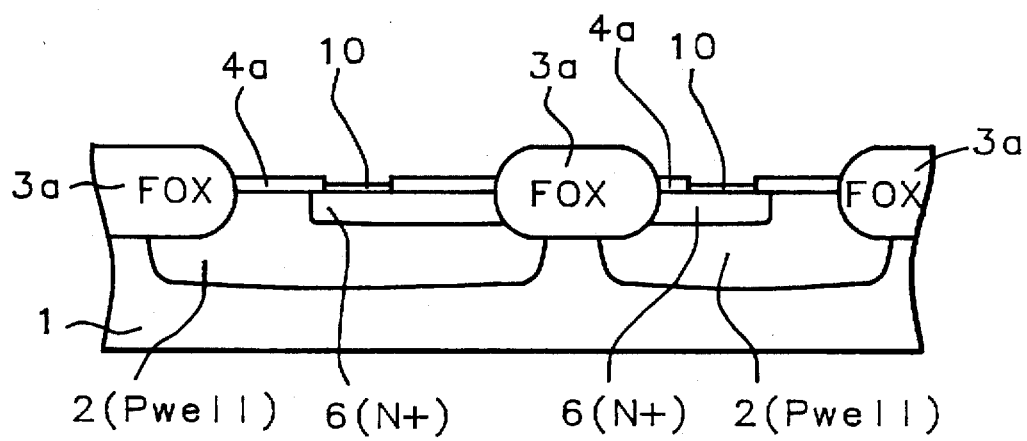
FIG. 4
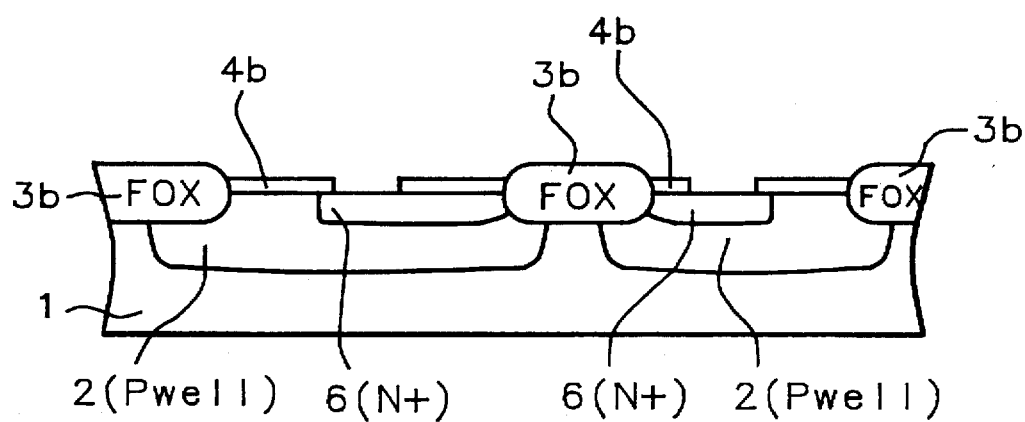
FIG. 5 - Prior Art

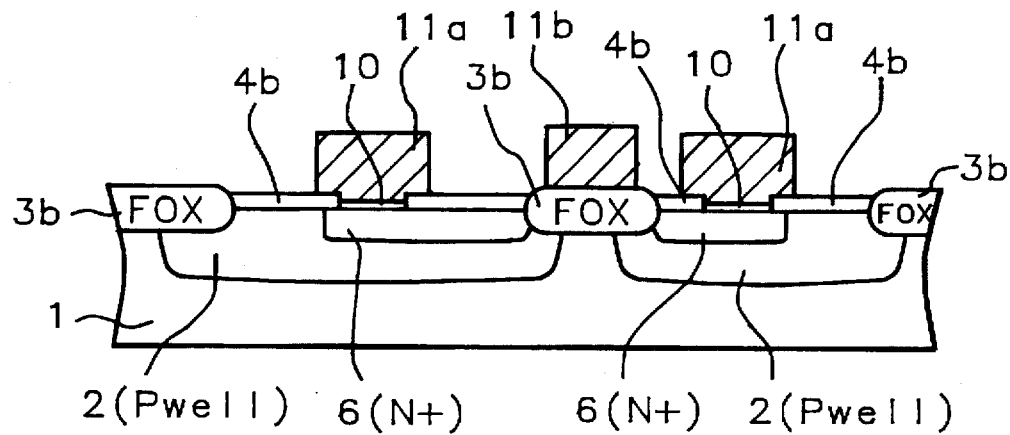
FIG. 6 - Prior Art
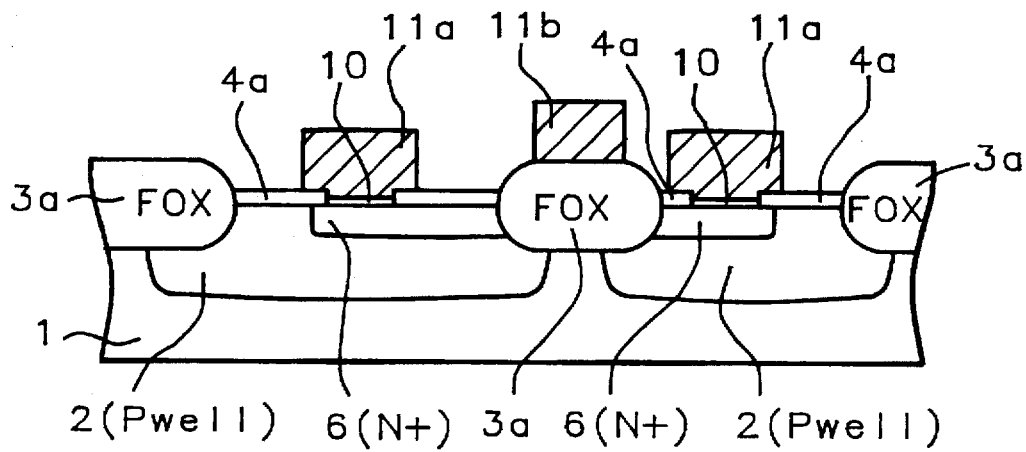
FIG. 7

5,744,391

METHOD TO IMPROVE ISOLATION BETWEEN EEPROM DEVICES VIA A FIELD OXIDE ANNEAL

BACKGROUND OF THE INVENTION (1) Field of the Invention

The present invention relates to a semiconductor fabrication process used to create an erasable electrical programmable read only memory, (EEPROM), device, and more specifically to a method for improving the isolation between devices in an EEPROM cell.

(2) Description of the Prior Art

The trend to fast, low power, non-volatile memory devices has benefitted by advances in specific semiconductor fabrication disciplines, such as advanced photolithography, regarding the use of more sophisticated exposure cameras, as well as the use of more sensitive photoresist materials, both contributing to the routine attainment of sub-half micron features, in semiconductor devices. In addition the use of novel processing schemes, such as sidewall image transfer, described by Ogura, et al, in U.S. Pat. No. 4,648,937, has also allowed sub-quarter micron features, in semiconductor devices to be fabricated, via use of sidewall processes, consisting of conformal depositions, and anisotropic reactive ion etching, (RIE), procedures. The rapid development of these process disciplines and process features have allowed fast, low power, EEPROM devices to be achieved.

A major feature of a EEPROM device is a tunnel insulator layer, which allows the cell to be programmed and erased via Fowler-Nordheim tunneling. Field oxide, (FOX), regions are used for physical and electrical isolation between EEPROM cells, or between specific devices in an EEPROM cell. However specific processing steps, such as a tunnel ion implantation procedure, result in implanting dopants entering the FOX layer, and increasing the etch rate of the FOX layer, in hydrofluoric, (HF), containing wet etchants. Since wet etchants are used in the fabrication sequence of EEPROM devices, a initially thick, FOX region, can be significantly thinned as a result of subjection to wet clean treatments, containing HF. The thinning of the FOX region, and subsequent decrease in isolation between EEPROM cells, or devices, can result in deleterious device parameters. This invention will teach a process for fabricating semiconductor device cells, such as EEPROM cells, consisting of tunnel transistors, separated by a FOX region, in which the thinning of the FOX region via subjection to wet treatments, incorporating HF, is minimized by the addition of a post-tunnel implant anneal procedure. Prior art, such as Roberts, in U.S. Pat. No. 5,376,577, describes a process for forming a static random access memory, (SRAM), device, in which the FOX region is subjected to an ion implantation procedure, followed by the growth of a sacrificial oxide layer on the FOX region, performed to protect the implanted FOX region from subsequent wet etch treatments. However the addition of a sacrificial oxide would not be desirable to an EEPROM process, and therefore the post-tunnel implant, anneal procedure, is the preferred procedure for the EEPROM process.

SUMMARY OF THE INVENTION

It is an object of this invention to fabricate semiconductor devices, such as EEPROM devices using thick, field oxide regions, for isolation between semiconductor devices.

It is another object of this invention to use an arsenic or phosphorous ion implantation procedure to create doped regions in a semiconductor device, such as a tunnel implant region for an EEPROM device.

It is still another object of this invention to use a high temperature anneal procedure, after the arsenic or phosphorous ion implantation procedure, such as the tunnel implant process used for EEPROM devices, but before wet etching procedures, containing hydrofluoric acid, to reduce the etch rate of the FOX regions, during the wet etch procedures, and to therefore maintain the thickness of the FOX region, and maintain the isolation integrity between semiconductor devices.

In accordance with the present invention a method of fabricating semiconductor devices, such as EEPROM devices, featuring field oxide regions used for isolation, and using a thermal anneal process to reduce the thinning of the isolating field oxide region during wet processing applications, has been developed. After creation of a P well region to be used for N type tunnel transistors, of an EEPROM cell, a pattern of field oxide, (FOX), regions is thermally grown. A sacrificial silicon oxide layer is thermally grown on the P well surface, in areas not covered by FOX regions. Photolithographic procedures are used to allow a region of the P well, as well as an isolating FOX region, between subsequent EEPROM devices, to experience a ion implantation step, used to create the tunnel region, for a tunnel transistor of a EEPROM cell. A thermal anneal procedure is next employed to distribute the tunnel implant dopant in the FOX region, recovering the damage of the field oxide due to the tunnel implant, thus reducing the removal rate of the isolating FOX region, when the FOX region is subjected to HF containing, wet solutions. Another photolithographic, and wet etch procedure, is then used to open a hole in the sacrificial silicon oxide layer, exposing the top surface of the tunnel implant region. Photoresist removal is followed by blanket wet cleans, containing dilute or buffered hydrofluoric acid. A tunnel oxide layer is regrown on the surface of the tunnel implant region, exposed in the opening in the sacrificial silicon oxide layer. A layer of polysilicon is deposited and patterned, using photolithographic and reactive au etching procedures, to create the polysilicon gate structures for the tunnel transistors of the EEPROM cell, with the polysilicon gate structures also traversing FOX regions.

BRIEF DESCRIPTION OF THE DRAWINGS

The object and other advantages of this invention are best described in the preferred embodiments with reference to the attached drawings that include:

FIG. 1–4, which schematically, in cross-sectional style, describe the key stages of fabrication of an N type, tunnel transistor, of an EEPROM cell, using the post-tunnel implant, high temperature anneal procedure, to a point in the process after the growth of the tunnel oxide layer.

FIG. 5, which schematically, in cross-sectional style, describes prior art, in which the FOX isolation region, is thinned as a result of HF containing, pre-clean solutions, used prior to growth of the tunnel oxide layer.

FIG. 6, which schematically, in cross-sectional style, shows the formation of polysilicon gate structures on tunnel transistors of an EEPROM cell, for prior art, including polysilicon gate structures traversing the thinned FOX isolating region, between N tunnel devices.

FIG. 7, which schematically, in cross-sectional style, shows the polysilicon gate structures used for the N type tunnel transistors, and the polysilicon gate structures traversing the isolating FOX regions, which were not significantly thinned during previous processing.

DESCRIPTION OF THE PREFERRED EMBODIMENTS

The method of fabricating devices used in EEPROM cell, N type tunnel transistors, for this case, will now be described in detail. This invention of annealing to reduce the rate of isolating FOX regions, although shown using N type tunnel transistors as an example, can also be applied to maintain the isolation integrity of FOX regions between other devices of an EEPROM cell, such as coupling capacitors, high voltage and low voltage transistors.

Figure 1:
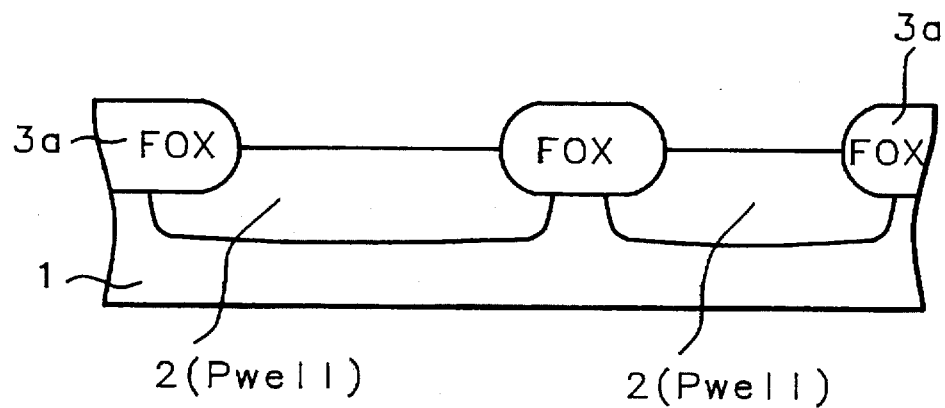

FIG. 1, shows the early stages of processing, used to fabricate N type, tunnel transistors, of an EEPROM cell, separated by FOX regions, 3a. A P type, silicon substrate, 1, with a <100> crystallographic orientation is used. P well regions, 2, are formed in areas to subsequently contain for N type, tunnel transistors, via photolithographic blockout procedures, allowing an ion implantation of $B^1$ to be performed at an energy between about 70 to 110 KeV, at a dose between about 8E11 to 2E13 atoms/cm$^2$, in areas not blocked by photoresist. After removal of photoresist via plasma oxygen ashing and careful wet cleans, a composite insulator layer, consisting of a thermally grown, underlying silicon dioxide layer, and an overlying silicon nitride layer, deposited using either low pressure chemical vapor deposition, (LPCVD), or plasma enhanced chemical vapor deposition, is formed on the silicon substrate, 1. A photoresist shape, is used as a mask to create an oxidation resistant, composite insulator shape, in the silicon nitride - silicon dioxide layers, via an reactive ion etching procedures, using CHF$_3$ as an etchant. After removal of the photoresist shape, using plasma oxygen ashing and careful wet cleans, the oxidation resistant, composite insulator shape is used as a mask to allow a FOX region, 3a, to be thermally grown in unmasked regions of silicon substrate, 1. Fox regions, 3b, are thermally grown in an oxygen-steam ambient, at a temperature between about 850° to 1050°, to an initial thickness, between about 4800 to 5200 Angstroms. The oxidation resistant, composite insulator shape, is removed, using hot phosphoric acid for the overlying silicon nitride layer, and a buffered HF solution for the underlying silicon dioxide layer, resulting in the structure shown schematically in FIG. 1.

Figure 2:
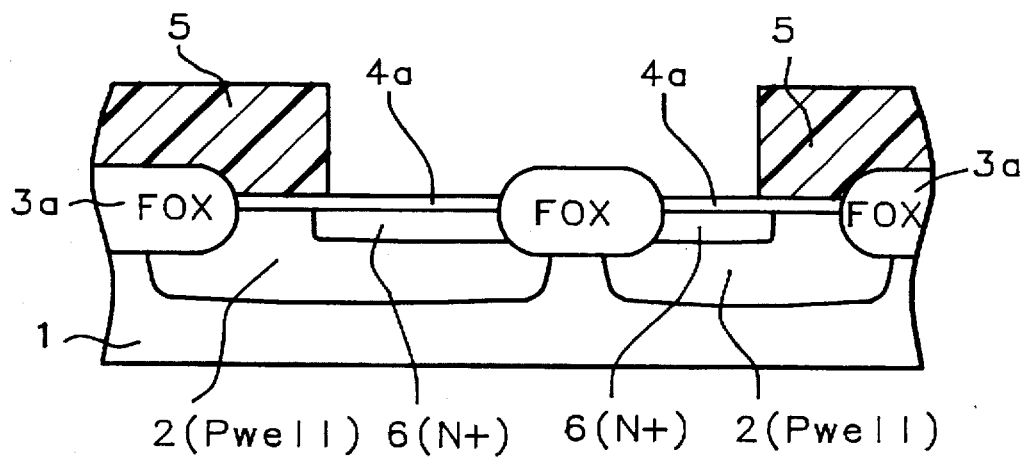

A sacrificial silicon oxide layer, 4a, of silicon dioxide, is next thermally grown, in an oxygen-steam ambient, at a temperature between about 800° to 1000° C., to an initial thickness between about 200 to 400 Angstroms. A photoresist shape, 5, is then formed to block specific regions of the silicon substrate, 1, from a subsequent, tunnel ion implantation procedure. The process used to create N type, tunnel implant region, 6, schematically shown in FIG. 2, is obtained via ion implantation of arsenic, at an energy between about 60 to 100 KeV, at a dose between about 7.5E13 to 1.25E14 atoms/cm$^2$. The FOX region, 3a, located between the two N type, tunnel transistors, is also subjected to this ion implantation procedure, with a high dopant region of arsenic resulting at, or near the top surface of FOX region, 3a. Removal of photoresist shape, 5, is accomplished via plasma oxygen ashing and careful wet cleans.

If the FOX region, 3a, containing the high dopant concentration of arsenic, near the top surface of FOX region, 3a, were to remain with a high arsenic doping profile, subsequent wet etch processes, using a HF component, and used for pre-clean procedures, would result in a severe thinning of FOX region, 3a, due to increased removal rate of arsenic doped FOX regions, with the removal rate of the FOX region increasing with increasing arsenic dopant concentration. Therefore a critical, post tunnel implant thermal anneal procedure is employed to equally distribute the high concentration of arsenic, near the top surface of FOX region, 3b, throughout the entire layer of FOX region, 3a, thus resulting in a lowering of arsenic concentration at, or near, the top surface of FOX region, 3a, and thus reducing the removal rate of the FOX layer, during subsequent wet pre-clean procedures, employing HF. The critical anneal procedure is performed in an oxygen - nitrogen ambient, at a temperature between about 875° to 1000° C., for a time between about 20 to 120 min.

Figure 3:
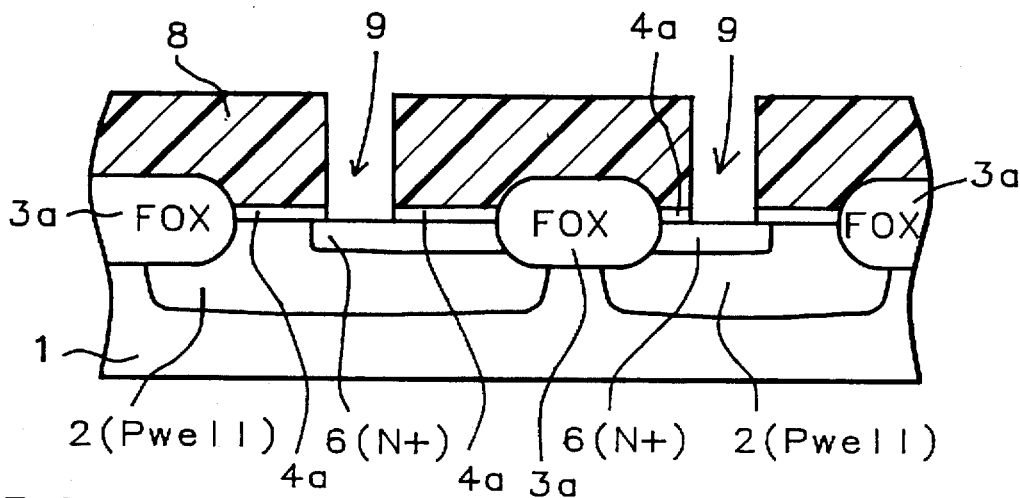

Another photoresist shape, 8, schematically shown in FIG. 3, defines opening, 9. A wet etch procedure, using dilute HF, about 50 parts water to 1 part HF, or a buffered HF solution, is used to remove sacrificial silicon oxide layer, 4a, in the region of opening, 9. After removal of photoresist shape, 8, via plasma oxygen ashing and careful wet cleans, a tunnel oxide layer, 10, of silicon dioxide, schematically shown in FIG. 4, is regrown on the top surface of N type, tunnel implant region, 6, via thermal oxidation in an oxygen-steam ambient, at a temperature between about 800° to 1000° C., to a thickness between about 80 to 110 Angstroms. The photoresist removal of photoresist shape, 8, used prior to tunnel oxide layer, 10, was followed by a pre-clean using either a 50:1, dilute HF solution, or a buffered HF solution, at a temperature between about 20° to 25° C. This procedure resulted in a minimum reduction in thickness of FOX region 3a, due to the reduction of arsenic concentration at, or near the surface of FOX region, 3a. Without the post-tunnel implant anneal procedure, a larger thickness of FOX region, 3a, would have been removed.

FIG. 5, shows prior art, in which the identical procedures are used to fabricate N type, tunnel transistors, however with the prior art the critical post-tunnel implant anneal, used prior to growing tunnel insulator layer, 10, is not performed. The pre-clean, using the same 50:1 or dilute buffered HF procedures, used prior to thermally growing tunnel oxide layer, 10, resulted in removal of between about 1700 to 1800 Angstroms of FOX region, 3a, resulting a thinner FOX region, 3b, between about 1950 to 2100 Angstroms, schematically. Another pre-clean, in a dilute or buffered HF solution, prior the growth of the tunnel oxide layer continues the thickness reduction of FOX region, 3b, now at a thickness between about 1450 to 1600 Angstroms, schematically shown in FIG. 5. Subsequent polysilicon deposition and patterning, to create polysilicon gate structures, 11a, overlying tunnel oxide layer, 10, and polysilicon gate structure, 11b, traversing the thinned, FOX region, 3b, are shown schematically in FIG. 6. The reduction in the thickness of the high arsenic doped FOX region, as a result of HF pre-cleans, reduces isolation characteristics. Polysilicon gate structures, on FOX region, 3b, can only sustain between about 12 to 15 volts, at 1 microampere of current, as compared to counterparts, in which polysilicon gate structures, on less-thinned, FOX regions, 3a, can sustain between about 17 to 20 volts.

Referring back to this invention, FIG. 7, shows the creation of polysilicon gate structures, 11a and 11b. A pre-clean, using a dilute HF solution, comprised of about 50 parts water to about 1 part HF, or buffered HF solution, at a temperature between about 20° to 25° C., is used prior to a deposition of a polysilicon layer, deposited using LPCVD procedures, at a temperature between about 500° to 700° C., to a thickness between about 1350 to 1750 Angstroms. The polysilicon layer can be deposited intrinsically and doped via ion implantation procedures using arsenic or phosphorous, or the polysilicon layer can be deposited using an in situ doping procedure by adding either arsine or phosphine to a silane ambient. Conventional photolithographic and reactive ion etching procedures, using C12 as an etchant, are used to create polysilicon gate structures, 11a, on tunnel oxide layer, 10, or polysilicon gate structure, 11b, traversing FOX region, 3a. Photoresist removal is once again performed using plasma oxygen ashing and careful wet cleans. The ability of FOX region, 3a, to retain a thickness between about 2600 to 2800 Angstroms, as a result of only a minimum of removal in previous HF cleans, due to the post-tunnel implant anneal procedure, results in superior isolation characteristics, compared to counterparts fabricated without the critical, post-tunnel anneal process.

Although this invention has been described as isolation improvements, as a function of a post-ion implantation anneal of a FOX region, for tunnel transistors of an EEPROM cell, it should be noted that this invention can also be used to improve the isolation characteristics between other elements, such as capacitors, resistors, as well as transistors, and for various cell designs, such as EEPROM, static random access memory, (SRAM), and dynamic random access memory, (DRAM).

While this invention has been particularly shown and described with reference to the preferred embodiments thereof, it will be understood by those skilled in the art that various changes in form and details may be made without departing from the spirit and scope of this invention.

What is claimed is:

1. A method of fabricating semiconductor devices, on a semiconductor substrate, using a field oxide region for isolation between said semiconductor devices, in which said field oxide region is annealed following N type, ion implantation procedures, to reduce the removal rate of said field oxide regions, in hydrofluoric acid solutions, thus improving the isolation between said semiconductor devices, separated by said field oxide regions, comprising the steps of:

forming said field oxide regions in said semiconductor substrate;

ion implanting an N type, imparting dopant into regions of said semiconductor substrate, not covered by said field oxide regions, and into a top portion of said field oxide region;

annealing to distribute said N type, imparting dopant from said top portion of said field oxide region, throughout said field oxide region.

2. The method of claim 1, wherein said semiconductor devices, separated by said field oxide region, are EEPROM devices.

3. The method of claim 1, where said semiconductor devices, separated by said field oxide region, are N channel and P channel, MOSFET devices, used in a static random access memory, (SRAM), cell.

4. The method of claim 1, wherein said semiconductor devices, separated by said field oxide region, are resistors.

5. The method of claim 1, wherein said semiconductor devices, separated by said field oxide region, are capacitors.

6. The method of claim 1, wherein said N type, imparting dopant is arsenic or phosphorous, ion implanted at a dose between about 5E13 to 1E16 atoms/cm$^2$.

7. The method of claim 1, wherein said anneal used to reduce removal rate of said field oxide region in hydrofluoric acid solutions, is performed in an oxygen - nitrogen ambient, at a temperature between about 87° to 1000° C., for a time between about 20 to 120 min.

8. A method of fabricating an erasable electrical programmable read only memory, (EEPROM), cell, on a semiconductor substrate, using a post-tunnel ion implantation anneal procedure, used to reduce the etch rate of a field oxide, (FOX), region, in solutions containing hydrofluoric acid, thus improving the isolation between tunnel transistor devices in said EEPROM cell, separated by said FOX region, comprising the steps of:

ion implanting a first conductivity imparting dopant into a first portion of said semiconductor substrate, to form P well regions in said first portion of said semiconductor substrate, to be used for said tunnel transistor devices;

forming FOX regions in said semiconductor substrate, between said P well regions;

growing a sacrificial silicon oxide layer on the surface of said P well regions, between said FOX regions;

ion implanting a second conductivity imparting dopant into regions of said P well regions, adjacent to said FOX region, to create tunnel implant regions, for said tunnel transistor devices, and also ion implanting a second conductivity imparting dopant into a top portion of said FOX region, located between said tunnel implant regions, of said tunnel transistor devices;

annealing to distribute said second conductivity imparting dopant from said top portion of said FOX region, throughout said FOX region, reducing concentration of said second conductivity imparting dopant, in said top portion of said FOX region;

opening a hole in said sacrificial silicon oxide layer, exposing top surface of said tunnel implant region;

a first pre-clean procedure;

growing a tunnel oxide layer on top surface of said tunnel implant region, exposed in said hole, in said sacrificial silicon oxide layer;

a second pre-clean procedure;

depositing a polysilicon layer; and patterning of said polysilicon layer to create polysilicon gate structures, in regions overlying tunnel oxide layer, for said tunnel transistor devices, and creating said polysilicon gate structure, overlying said FOX region, where said FOX region is located between said tunnel transistor devices.

9. The method of claim 8, wherein said first conductivity imparting dopant, used to create said P well regions, is $B^{11}$, ion implanted at an energy between about 70 to 110 KeV, at a dose between about 8E11 to 2E13 atoms/cm$^2$.

10. The method of claim 8, wherein said FOX region is grown via thermal oxidation in an oxygen-steam ambient, at a temperature between about 850° to 1050° C., to a thickness between about 4800 to 5200 Angstroms.

11. The method of claim 8, wherein said sacrificial silicon oxide layer is silicon dioxide, thermally grown in an oxygen-steam ambient at a temperature between about 800° to 1000° C., to a thickness between about 200 to 400 Angstroms.

12. The method of claim 8, wherein said second conductivity imparting dopant, used to create said tunnel implant region, for said tunnel transistor device, is arsenic, ion implanted at an energy between about 60 to 100 KeV, at a dose between about 7.5E13 to 1.25E14 atoms/cm$^2$.

13. The method of claim 8, wherein said anneal, used to distribute said second conductivity imparting dopant from said top portion of said FOX region, throughout said FOX region, and to reduce the concentration of said second conductivity imparting dopant in said top portion of said FOX region, is performed in an oxygen - nitrogen ambient, at a temperature between about 875° to 1000° C., for a time between about 20 to 120 min.

14. The method of claim 8, wherein said first pre-clean procedure, is performed using either a dilute HF solution, comprised of about 50 parts water to 1 about part HF, or using a buffered HF solution, at a temperature between about 20° to 25° C.

15. The method of claim 8, wherein said tunnel oxide layer is silicon dioxide, thermally grown in an oxygen-steam ambient, at a temperature between about 800 to 1000° C., to a thickness between about 80 to 110 Angstroms.

16. The method of claim 8, wherein said polysilicon layer is deposited using LPCVD procedures, at a temperature between about 500° to 700° C., to a thickness between about 1350 to 1700 Angstroms.

* * * * *